United States Patent
Kim

(10) Patent No.: US 8,649,235 B2
(45) Date of Patent: Feb. 11, 2014

(54) SEMICONDUCTOR MEMORY DEVICE AND OPERATING METHOD THEREOF

(75) Inventor: Gyung-Tae Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 439 days.

(21) Appl. No.: 12/917,584

(22) Filed: Nov. 2, 2010

(65) Prior Publication Data

US 2012/0051163 A1  Mar. 1, 2012

(30) Foreign Application Priority Data

Aug. 30, 2010  (KR) .................... 10-2010-0083965

(51) Int. Cl.
*G11C 7/00*  (2006.01)

(52) U.S. Cl.
USPC .................... 365/200; 365/201; 365/225.7

(58) Field of Classification Search
USPC ....................... 365/200, 201, 225.7
See application file for complete search history.

(56) References Cited

U.S. PATENT DOCUMENTS

| | | | | |
|---|---|---|---|---|
| 7,688,659 B2* | 3/2010 | Mori et al. | ..................... | 365/201 |
| 7,961,508 B2* | 6/2011 | Choi et al. | ..................... | 365/163 |
| 8,059,477 B2* | 11/2011 | Yoon | ............................. | 365/200 |
| 8,193,851 B2* | 6/2012 | Kim | ............................. | 327/525 |
| 2006/0125548 A1* | 6/2006 | Kitayama et al. | ............. | 327/525 |
| 2010/0295605 A1* | 11/2010 | Kim | ............................. | 327/525 |

FOREIGN PATENT DOCUMENTS

| | | |
|---|---|---|
| KR | 1020050003035 | 1/2005 |
| KR | 1020050015721 | 2/2005 |
| KR | 1020090011211 | 2/2009 |

OTHER PUBLICATIONS

Office Action issued by the Korean Intellectual Property Office on Jan. 13, 2012.

\* cited by examiner

*Primary Examiner* — Connie C. Yoha
(74) *Attorney, Agent, or Firm* — IP & T Group LLP

(57) ABSTRACT

A semiconductor memory device includes an enable fuse unit configured to generate a repair enable signal corresponding to a cutting state of an enable fuse after a power-up operation starts, and an address fuse unit enabled in response to the repair enable signal, and configured to generate an output signal in response to an external address and whether or not an address fuse is programmed.

16 Claims, 4 Drawing Sheets

SEMICONDUCTOR MEMORY DEVICE AND OPERATING METHOD THEREOF

CROSS-REFERENCE TO RELATED APPLICATIONS

The present application claims priority of Korean Patent Application No, 10-2010-0083965, filed on Aug. 30, 2010, which is incorporated herein by reference in its entirety.

BACKGROUND OF THE INVENTION

Exemplary embodiments of the present invention relate to a semiconductor design technology, and more particularly, to a semiconductor memory device including a fuse circuit in which an address corresponding to a repair target memory cell is programmed.

In general, a semiconductor memory device including a double data rate synchronous DRAM (DDR SDRAM) is provided with a large number of memory cells. As fabrication technologies are being advanced, the integration density of the semiconductor memory device gradually increases and the number of memory cells provided in the semiconductor memory device also gradually increases. When a fail occurs in any one of the memory cells, a corresponding semiconductor memory device may not perform a desired operation and thus may be discarded as a defective product. As fabrication technologies for semiconductor memory devices are being advanced, a fail may occasionally occur in memory cells. If an entire semiconductor memory device is discarded as a defective product due to such fails, the product yield may suffer. In order to address such a concern, redundancy memory cells as well as normal memory cells are provided within a semiconductor memory device. When a fail occurs in a normal memory cell, it is replaced with a redundancy memory cell. A failed normal memory cell which is to be replaced with a redundancy memory cell may be referred to as a "repair target memory cell."

Meanwhile, a semiconductor memory device includes a fuse circuit which can program an address corresponding to a repair target memory cell (hereinafter, referred to as a repair target address). A programming refers to a series of operations for storing a repair target address in a fuse circuit.

In general, a fuse circuit includes a plurality of fuses. Representative methods for programming such fuses include a laser cutting method and an electrical cutting method. According to the laser cutting method, a cutting target fuse corresponding to a repair target address is blown and cut by a laser beam. According to the electrical cutting method, a cutting target fuse is melted and cut by applying an overcurrent thereto. The laser cutting method may be performed at a wafer level which is prior to a package level of a semiconductor memory device, and the electric cutting method may performed at a package level. Since the laser cutting method is simpler than the electrical cutting method, it is widely used. However, the electrical cutting method is also widely used because it can be performed even after the packaging step.

As described above, the address corresponding to the repair target memory cell is programmed in the fuse circuit. That is, the repair target address is programmed in the fuse provided in the fuse circuit, and the semiconductor memory device performs the repair operation by using the programmed repair target address. In other words, when an external address is for accessing the repair target memory cell, the semiconductor memory device can perform the repair operation to access the redundancy memory cell instead of the repair target memory cell by comparing the external address with the programmed repair target address.

FIG. 1 is a circuit diagram illustrating a conventional address fuse unit of a semiconductor memory device.

Referring to FIG. 1, the address fuse unit includes a fuse driving unit 110 and a fuse information output unit 120. The fuse driving unit 110 is enabled in response to a fuse enable signal FSE, and drives a voltage of a first node N1 in response to a repair target address which is programmed in an address fuse F. That is, the address fuse F is in a cut state or in an uncut state according to the repair target address programmed therein, and the voltage of the first node N1 is driven to a logic low level or a logic high level according to whether the address fuse F is in a cut state or an uncut state. Here, the fuse enable signal FSE is activated after a power-up operation starts when a power supply voltage VDD applied to the semiconductor memory device is higher than a certain voltage level.

The fuse information output unit 120 outputs an output signal OUT by inverting or non-inverting an address signal XA corresponding to an external address in response to a voltage level of the first node N1. That is, the output signal OUT is determined according to the voltage level of the first node N1 and the address signal XA. Here, since the voltage of the first node N1 is driven according to whether the address fuse F is in a cut or an uncut state, the output signal OUT is outputted in response to a comparison value between the repair target address programmed in the address fuse F and the address signal XA corresponding to the external address.

Meanwhile, the semiconductor memory device performs an initialization operation according to whether the address fuse F is in a cut or an uncut state after the power-up operation starts. In other words, the fuse enable signal FSE transitions to a logic low level from a logic high level after a power-up operation starts, and the fuse driving unit 110, responding to the fuse enable signal FSE, performs the initialization operation by driving the voltage of the first node N1 according to whether the address fuse F is in a cut or an uncut state, as shown in FIG. 2.

FIG. 2 is a waveform illustrating the initialization operation of the fuse driving unit 110 shown in FIG. 1.

The initialization operation of the fuse driving unit 110 is classified into two types, i.e., <NO CUT> and <CUT>, according to whether the address fuse F is in a cut or an uncut state.

First, referring to FIGS. 1 and 2, a case where the address fuse F is in an uncut state <NO CUT> is described in detail. A first NMOS transistor NM11 of the fuse driving unit 110 is turned on in response to the fuse enable signal FSE of a logic high level, and the voltage level of the first node N1 becomes a logic low level. At this time, since a second NMOS transistor NM12, which is formed as a latch type and receives a signal derived and fed back from the first node N1, is turned on, the voltage level of the first node N1 maintains a logic low level.

When the fuse enable signal FSE transitions to a logic low level from a logic high level after the power-up operation starts, a first PMOS transistor PM11 is turned on and thus the power supply voltage VDD is supplied to the first node N1. Here, due to a conflict between current flowing through the address fuse F and the first PMOS transistor PM11, and current flowing through the second NMOS transistor NM12, the voltage level of the first node N1 increases. As a result, when the address fuse F is in an uncut state, the voltage level of the first node N1 becomes a logic high level.

Next, referring to FIGS. 1 and 2, a case where the address fuse F is in a cut state <CUT> is described in detail. The first NMOS transistor NM11 of the fuse driving unit 110 is turned on in response to the fuse enable signal FSE of a logic high level, and the voltage level of the first node N1 becomes a logic low level. At this time, since the second NMOS transistor NM12, which is formed as a latch type and receives a signal derived and fed back from the first node N1, is turned on, the voltage level of the first node N1 maintains a logic low level.

When the fuse enable signal FSE transitions to a logic low level from a logic high level after the power-up operation starts, the first PMOS transistor PM11 is turned on. At this time, since the address fuse F is in a cut state, the power supply voltage VDD is not supplied to the first node N1. As a result, when the address fuse F is in a cut state, the voltage level of the first node N1 maintains the logic low level.

Meanwhile, an address fuse unit may not be used according to the number of the repair target memory cells. Accordingly, the address fuse F provided in such an address fuse unit may not be programmed. Since the non-programmed address fuse F generally remains in an uncut state, the address fuse unit including the non-programmed address fuse F has a waveform such as a case where the address fuse F is in the uncut state <NO CUT> shown in FIG. 2.

As described above, when the address fuse F is in the uncut state <NO CUT>, the voltage level of the first node N1 increases to a logic high level from a logic low level in the initialization operation. At this time, a conflict between current flowing through the address fuse F and the first PMOS transistor PM11, and current flowing through the second NMOS transistor NM12 occurs at the first node N1. Due to this current conflict, current from several ten mA to several hundred mA may be consumed. As the integration density of the semiconductor memory device increases and the number of memory cells increases, the number of the address fuse units also increases. Accordingly, the increased number of the address fuse units may not be used, increasing unnecessary current consumption due to the current conflict after the power-up operation starts more and more.

SUMMARY OF THE INVENTION

An embodiment of the present invention is directed to a semiconductor memory device which is capable of controlling activation of an address fuse unit including an address fuse according to whether the address fuse is programmed or not.

In accordance with an exemplary embodiment of the present invention, a semiconductor memory device includes an enable fuse unit configured to generate a repair enable signal corresponding to a cutting state of an enable fuse after a power-up operation starts, and an address fuse unit configured to be enabled in response to the repair enable signal and generate an output signal in response to an external address and whether or not an address fuse is programmed.

In accordance with another exemplary embodiment of the present invention, a semiconductor memory device includes an enable fuse unit configured to be enabled in response to a fuse enable signal and generate a repair enable signal corresponding to a cutting state of an enable fuse, an activation control unit configured to generate an activation control signal by controlling an activation of the fuse enable signal in response to the repair enable signal, and an address fuse unit configured to be enabled in response to the activation control signal, and generate an output signal in response to an external address and whether or not an address fuse is programmed.

In accordance with yet another exemplary embodiment of the present invention, a method for driving a semiconductor memory device includes generating a repair enable signal corresponding to whether or not an address fuse is programmed after a power-up operation starts, and determining whether or not a driving current path including the address fuse is formed in response to the repair enable signal.

In accordance with still yet another exemplary embodiment of the present invention, a semiconductor memory device includes an enable fuse unit configured to generate a repair enable signal depending on whether or not an address fuse is programmed, in response to a fuse enable signal, an activation control unit configured to generate an activation control signal by controlling an activation of the fuse enable signal in response to the repair enable signal, and an address fuse unit configured to generate an output signal by comparing an external address and a repair target address programmed in the address fuse, in response to the activation control signal.

The semiconductor memory device in accordance with the embodiment of the present invention can control whether an address fuse unit including an address fuse is activated or deactivated according to whether the address fuse is programmed or not. Accordingly, current consumption may be reduced/decreased after a power-up operation starts.

DESCRIPTION OF SPECIFIC EMBODIMENTS

Figure 1:
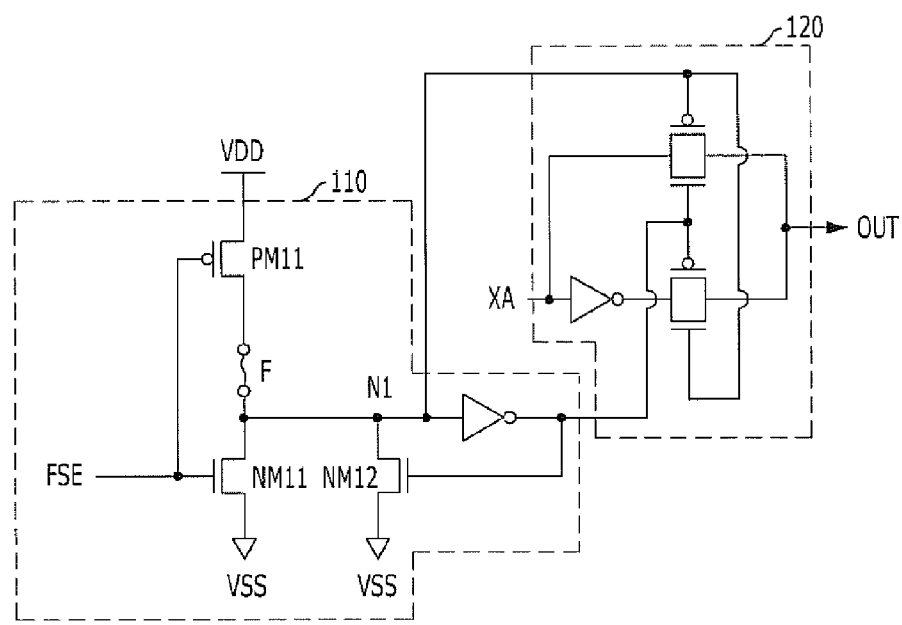
FIG. 1 is a circuit diagram illustrating a conventional address fuse unit of a semiconductor memory device.
Figure 2:
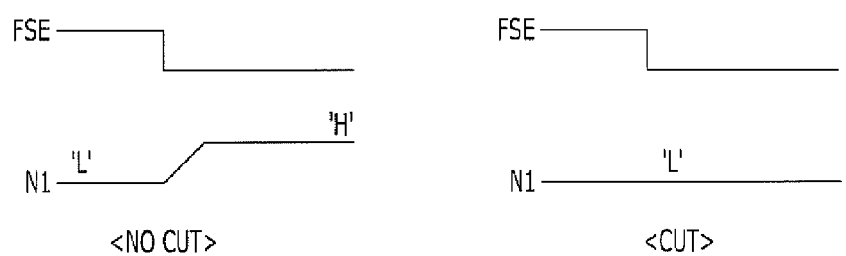
FIG. 2 is a waveform illustrating an initialization operation of a fuse driving unit shown in FIG. 1.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
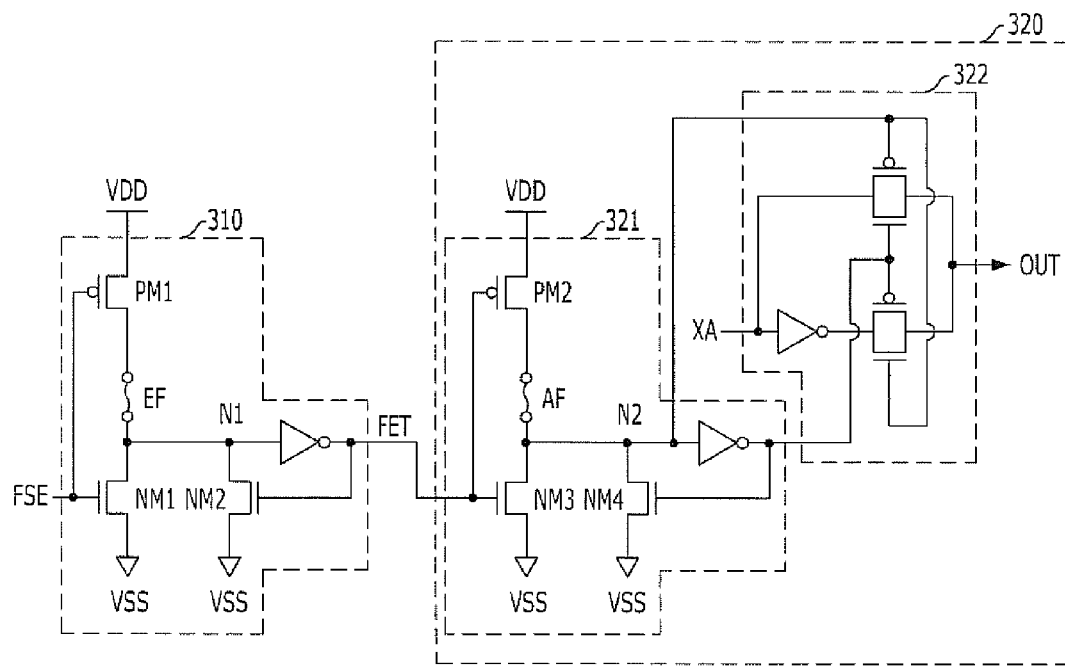
FIG. 3 is a circuit diagram illustrating a partial configuration of a semiconductor memory device in accordance with an embodiment of the present invention.

FIG. 3 is a block diagram illustrating a partial configuration of a semiconductor memory device in accordance with an embodiment of the present invention.

Referring to FIG. 3, the semiconductor memory device in accordance with the embodiment of the present invention includes an enable fuse unit 310 and an address fuse unit 320.

The enable fuse unit 310 generates a repair enable signal FET corresponding to whether an enable fuse EF is in a cut state or an uncut state. Here, the enable fuse unit 310 is enabled in response to a fuse enable signal FSE which is activated after a power-up operation starts when a power supply voltage VDD applied to the semiconductor memory device is higher than a certain voltage level. The enable fuse EF is in a cut state or an uncut state according to whether or not an address fuse AF is programmed.

The address fuse unit 320 is enabled in response to the repair enable signal FET, and generates an output signal OUT in response to an address signal XA corresponding to an external address and whether or not the address fuse AF is cut. The address fuse unit 320 includes a fuse driving unit 321 and a fuse information output unit 322.

The fuse driving unit 321 is enabled in response to the repair enable signal FET, and drives a voltage of a second node N2 in response to a repair target address which is programmed in the address fuse AF. The address fuse AF is included into a driving current path which is formed in response to the repair enable signal FET. Further, the address fuse AF is in a cut state or in an uncut state according to the repair target address programmed therein, and the voltage of the second node N2 is driven to a logic low level or a logic high level according to whether the address fuse AF is in a cut state or an uncut state.

The fuse information output unit 322 outputs the output signal OUT by inverting or non-inverting the address signal XA corresponding to the external address in response to a voltage level of the second node N2. That is, a voltage level of the output signal OUT is determined according to the voltage level of the second node N2 and the address signal XA. Here, since the voltage of the second node N2 is driven according to whether the address fuse AF is in a cut state or an uncut state, the output signal OUT is outputted in response to a comparison value between the repair target address programmed in the address fuse AF and the address signal XA corresponding to the external address.

For reference, the enable fuse unit 310 and the address fuse unit 320 are implemented with a static structure.

Figure 4:
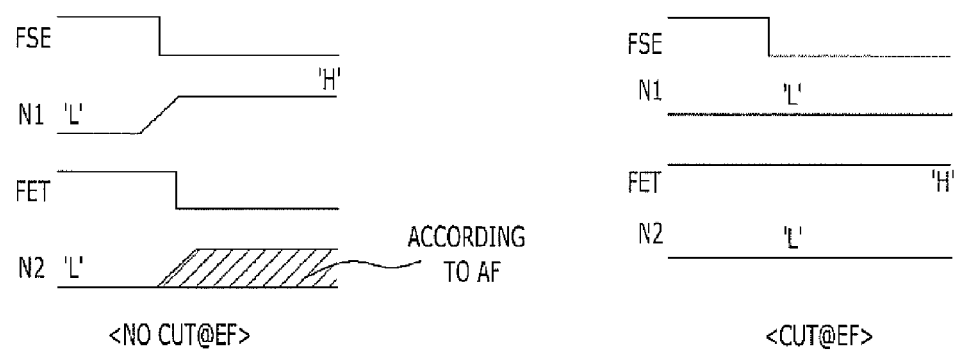
FIG. 4 is a waveform illustrating an initialization operation of circuits shown in FIG. 3.

FIG. 4 is a waveform illustrating an initialization operation of circuits shown in FIG. 3.

For convenience of explanation, it is assumed that the enable fuse EF is in an uncut state when the address fuse AF is programmed, and the enable fuse EF is in a cut state when the address fuse AF is not programmed.

First, referring to FIGS. 3 and 4, a case where the enable fuse EF is in the uncut state <NO CUT@EF> is described in detail.

A first NMOS transistor NM1 of the enable fuse unit 310 is turned on in response to the fuse enable signal FSE of a logic high level, and the voltage level of a first node N1 becomes a logic low level. At this time, since a second NMOS transistor NM2, which is formed as a latch type and receives a signal derived and fed back from the first node N1, is turned on, the voltage level of the first node N1 maintains a logic low level. Accordingly, the repair enable signal FET maintains a logic high level.

When the fuse enable signal FSE transitions to a logic low level from a logic high level after the power-up operation starts, a first PMOS transistor PM1 is turned on and thus the power supply voltage VDD is supplied to the first node N1. As a result, the repair enable signal FET transitions to a logic low level from a logic high level.

The address fuse unit 320 outputs the repair target address programmed in the address fuse AF to the second node N2 in response to the repair enable signal FET transitioning to a logic low level from a logic high level. That is, during a high duration of the repair enable signal FET, third and fourth NMOS transistors NM3 and NM4 are turned on, and thus a voltage of the second node N2 maintains a logic low level. On the contrary, during a low duration of the repair enable signal FET, a second PMOS transistor PM2 is turned on, and thus the voltage of the second node N2 is driven according to whether the address fuse AF is in a cut state or an uncut state.

Next, referring to FIGS. 3 and 4, a case where the enable fuse EF is in a cut state <CUT@EF> is described in detail.

The first NMOS transistor NM1 of the enable fuse unit 310 is turned on in response to the fuse enable signal FSE of a logic high level, and the voltage level of the first node N1 becomes a logic low level. At this time, since the second NMOS transistor NM12, which is formed as a latch type and receives a signal derived and fed back from the first node N1, is turned on, the voltage level of the first node N1 maintains a logic low level. Accordingly, the repair enable signal FET is in a logic high level.

When the fuse enable signal FSE transitions to a logic low level from a logic high level after the power-up operation starts, the first PMOS transistor PM1 is turned on. At this time, since the enable fuse EF is in the cut state, the power supply voltage VDD is not supplied to the first node N1. As a result, the repair enable signal FET maintains a logic high level.

The address fuse unit 320 receives the repair enable signal FET of a logic high level. Thus, the third NMOS transistor NM3 of the address fuse unit 320 continuously maintains a turn-on state after the power-up operation starts. Accordingly, a conflict between current flowing through the address fuse AF and the second PMOS transistor PM2, and current flowing through the second NMOS transistor NM2 may not occur at the second node N2.

As described above, in accordance with the exemplary embodiment of the present invention, the semiconductor memory device may control the driving current path including the address fuse AF according to whether the address fuse AF is programmed or not.

In other words, when the address fuse AF is programmed, i.e., the enable fuse EF is in an uncut state, the enable fuse unit 310 generates the repair enable signal FET transitioning to a logic low level from a logic high level, and the address fuse unit 320 forms a driving current path including the address fuse AF in response to the repair enable signal FET transitioning to a logic low level from a logic high level. Accordingly, the second node N2 has a predetermined voltage level corresponding to a programming state of the address fuse AF. On the contrary, when the address fuse AF is not programmed, i.e., the enable fuse EF is in a cut state, the enable fuse unit 310 generates the repair enable signal FET maintaining a logic high level, and the address fuse unit 320 does not form the driving current path. Accordingly, the second node N2 maintains a logic low level regardless of a programming state of the address fuse AF.

In the end, the semiconductor memory device in accordance with the exemplary embodiment of the present invention determines whether or not a driving current path including the address fuse AF is formed in response to the programming state of the address fuse AF. Accordingly, in the address fuse unit 320 with the address fuse AF which is not programmed, current consumption due to the current conflict after the power-up operation starts can be reduced/decreased.

Figure 5:
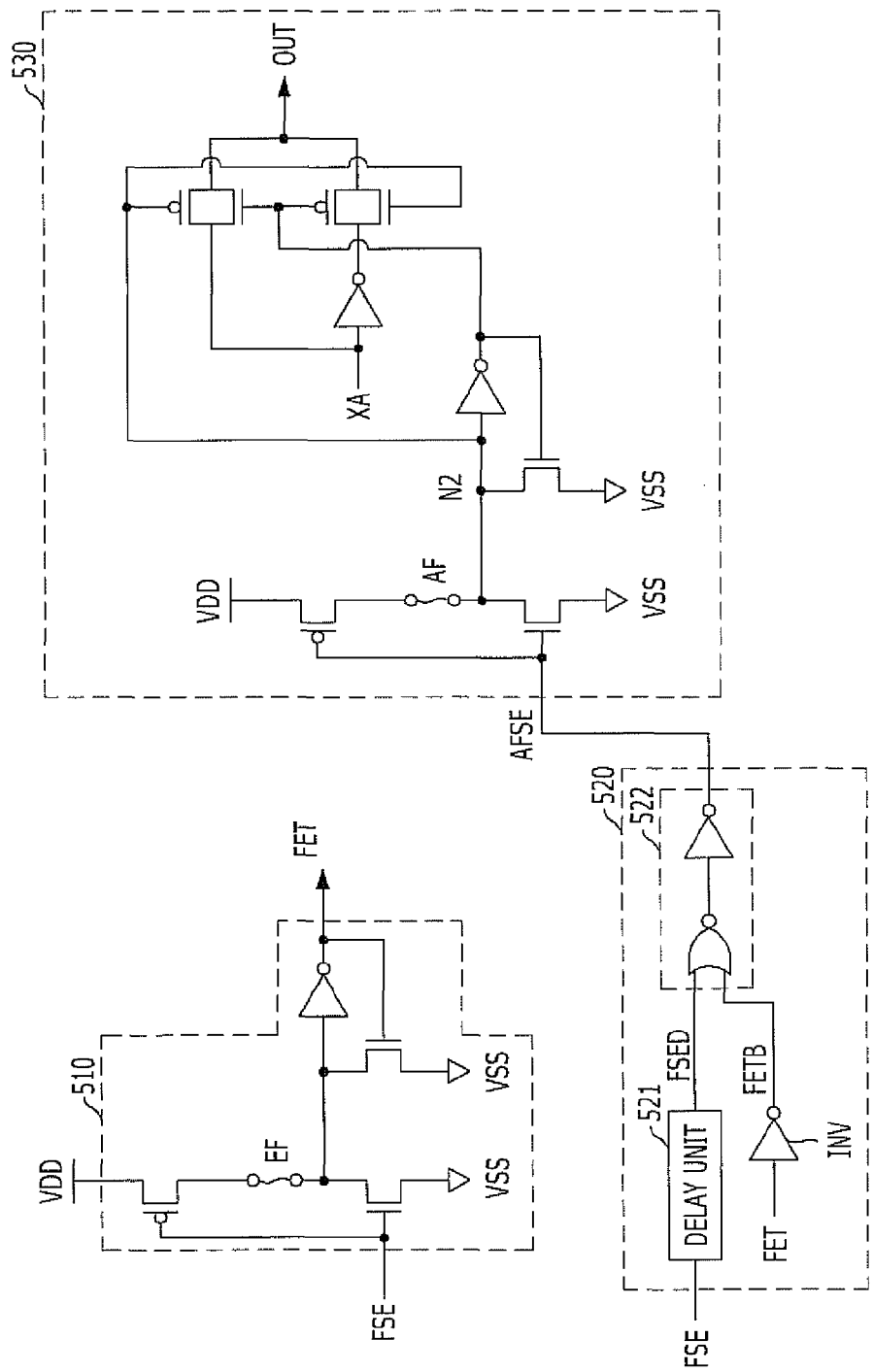
FIG. 5 is a circuit diagram illustrating a partial configuration of a semiconductor memory device in accordance with another embodiment of the present invention.

FIG. 5 is a circuit diagram illustrating a partial configuration of a semiconductor memory device in accordance with another embodiment of the present invention.

Referring to FIG. 5, the semiconductor memory device in accordance with the embodiment of the present invention includes an enable fuse unit 510, an activation control unit 520, and an address fuse unit 530.

The enable fuse unit 510 generates a repair enable signal FET corresponding to whether an enable fuse EF is in a cut state or an uncut state. Here, the enable fuse unit 510 is enabled in response to a fuse enable signal FSE which is activated after a power-up operation starts when a power supply voltage VDD applied to the semiconductor memory device is higher than a certain voltage level. The enable fuse EF is in a cut state or an uncut state according to whether an address fuse AF is programmed or not. The activation control unit 520 generates an activation control signal AFSE by controlling an activation of the fuse enable signal FSE in response to the repair enable signal FET. The address fuse unit 530 is enabled in response to the activation control signal AFSE, and generates an output signal OUT in response to an address signal XA corresponding to an external address and whether or not the address fuse AF is cut.

In comparison with the above-described embodiment, the activation control unit 520 generating the activation control signal AFSE is further included, and the address fuse unit 530 is enabled in response to the activation control signal AFSE. Hereinafter, constitutions of the activation control unit 520 are explained in detail.

The activation control unit 520 includes a delay unit 521, an inverter INV and an output unit 522. The delay unit 521 delays the fuse enable signal FSE by a predetermined delay time to output a delayed fuse enable signal FSED. The inverter INV inverts the repair enable signal FET to output an inverted repair enable signal FETB. The output unit 522 controls an activation of the delayed fuse enable signal FSED and outputs the activation control signal AFSE, in response to the inverted repair enable signal FETB. Here, the delay unit 521 may be implemented with a delay circuit having the predetermined delay time corresponding to 10 ns. The predetermined delay time of the delay unit 521 is a time for setting the repair enable signal FET corresponding to the enable fuse EF after the power-up operation starts, so as to prevent an unintentional current conflict.

Figure 6:
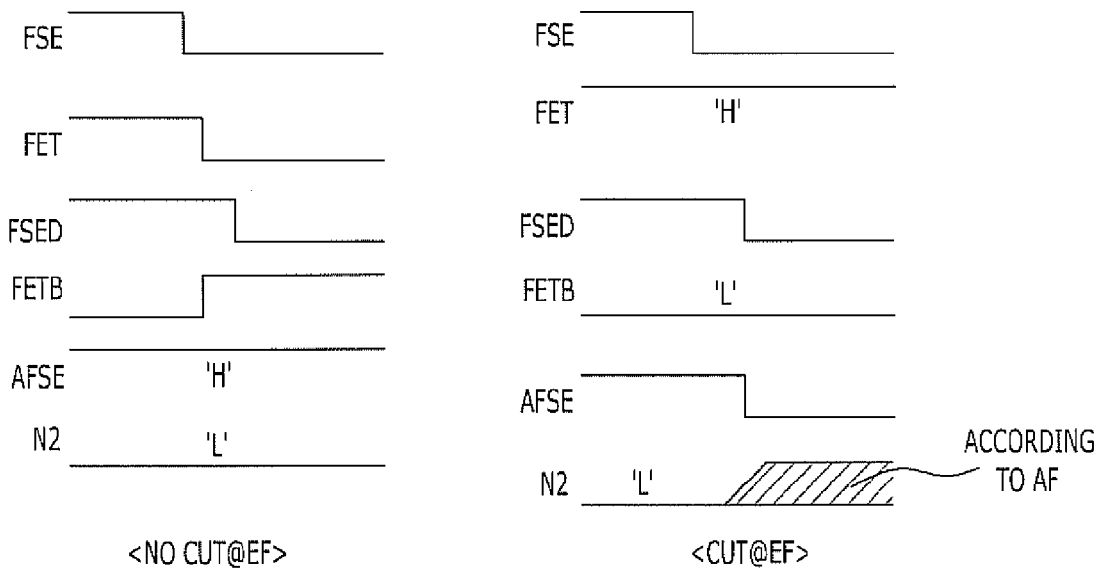
FIG. 6 is a waveform illustrating an initialization operation of circuits shown in FIG. 5.

FIG. 6 is a waveform illustrating an initialization operation of circuits shown in FIG. 5.

For convenience of explanation, it is assumed that the enable fuse EF is in a cut state when the address fuse AF is programmed, and the enable fuse EF is in an uncut state when the address fuse AF is not programmed.

First, referring to FIGS. 5 and 6, a case where the enable fuse EF is in the uncut state <NO CUT@EF> is described in detail.

When the fuse enable signal FSE transitions to a logic low level from a logic high level after the power-up operation start, the repair enable signal FET also transitions to a logic low level from a logic high level. The delay unit 521 of the activation control unit 520 delays the fuse enable signal FSE by the predetermined delay time to output the delayed fuse enable signal FSED, and the inverter INV inverts the repair enable signal FET to output the inverted repair enable signal FETB. At this time, even if the delayed fuse enable signal FSED transitions to a logic low level from a logic high level, the output unit 522 controls the activation control signal AFSE to maintain a logic high level in response to the inverted repair enable signal FETB. As a result, a voltage of a second node N2 maintains a logic low level regardless of a programming state of the address fuse AF, and thus a current conflict may not occur at the second node N2.

Next, referring to FIGS. 5 and 6, a case where the enable fuse EF is in a cut state <CUT@EF> is described in detail.

When the fuse enable signal FSE transitions to a logic low level from a logic high level after the power-up operation start, the repair enable signal FET maintains a logic high level. The delay unit 521 of the activation control unit 520 delays the fuse enable signal FSE by the predetermined delay time to output the delayed fuse enable signal FSED, and the inverter INV inverts the repair enable signal FET to output the inverted repair enable signal FETB of a logic low level. At this time, since the inverted repair enable signal FETB maintains a logic low level, the output unit 522 outputs the delayed fuse enable signal FSED as the activation control signal AFSE. As a result, a voltage of a second node N2 is driven to a logic low level or a logic high level in response to the activation control signal AFSE according to whether the address fuse AF is in a cut state or an uncut state.

As described above, in accordance with the exemplary embodiment of the present invention, the semiconductor memory device may control an activation of the fuse enable signal FSE in response to whether the address fuse AF is programmed or not.

In other words, when the address fuse AF is programmed, i.e., the enable fuse EF is in a cut state, the address fuse unit 530 is enabled in response to the activation control signal AFSE transitioning to a logic low level from a logic high level. Here, the activation control signal AFSE is activated in response to the fuse enable signal FSE. On the contrary, when the address fuse AF is not programmed, i.e., the enable fuse EF is in an uncut state, the activation control unit 520 controls the activation of the activation control signal AFSE in response to the repair enable signal FET. Accordingly, the voltage of the second node N2 maintains a logic low level regardless of a programming state of the address fuse AF.

In the end, the semiconductor memory device in accordance with the exemplary embodiment of the present invention determines whether or not a driving current path including the address fuse AF is formed, by controlling the activation of the fuse enable signal FSE using the repair enable signal FET. Accordingly, in the address fuse unit 530 with the address fuse AF which is not programmed, current consumption due to the current conflict after the power-up operation starts can be reduced/decreased.

In accordance with the exemplary embodiments of the present invention, current consumption can be reduced/decreased in comparison with the conventional semiconductor memory device. For instance, in case where the semiconductor memory device includes one enable fuse and 12 address fuses, the current consumption may be reduced/decreased up to 93% in comparison with the conventional semiconductor memory device.

Moreover, even if an address fuse unit includes the address fuse AF which is not programmed, the semiconductor memory device in accordance with the embodiments of the present invention can reduce/decrease power consumption by controlling the activation of the address fuse unit after the power-up operation starts.

While the present invention has been described with respect to the specific embodiments, it will be apparent to those skilled in the art that various changes and modifications may be made without departing from the spirit and scope of the invention as defined in the following claims.

Furthermore, the positions and types of the logic gates and transistors exemplified above in the foregoing embodiments may be differently implemented according to the polarities of the inputted signals.

What is claimed is:
1. A semiconductor memory device comprising:
an enable fuse unit configured to generate a repair enable signal corresponding to a cutting state of an enable fuse after a power-up operation starts; and
an address fuse unit configured to be enabled in response to the repair enable signal and generate an output signal in response to an external address and whether or not an address fuse is programmed,
wherein the enable fuse is in a cut state or an uncut state according to whether or not the address fuse is programmed.

2. The semiconductor memory device of claim 1, wherein the enable fuse unit and the address fuse unit are in a static structure.

3. The semiconductor memory device of claim 1, wherein the address fuse unit comprises:
a fuse driving unit configured to be enabled in response to the repair enable signal and drive a voltage of an output node in response to whether or not the address fuse is programmed; and
a fuse information output unit configured to output the output signal by inverting or non-inverting the external address in response to a voltage level of the output node.

4. The semiconductor memory device of claim 1, wherein a driving current path including the address fuse is formed in response to the repair enable signal.

5. A semiconductor memory device comprising:
an enable fuse unit configured to be enabled in response to a fuse enable signal and generate a repair enable signal corresponding to a cutting state of an enable fuse;
an activation control unit configured to generate an activation control signal by controlling an activation of the fuse enable signal in response to the repair enable signal; and
an address fuse unit configured to be enabled in response to the activation control signal, and generate an output signal in response to an external address and whether or not an address fuse is programmed,
wherein the enable fuse is in a cut state or an uncut state according to whether or not the address fuse is programmed.

6. The semiconductor memory device of claim 5, wherein the fuse enable signal is activated after a power-up operation starts.

7. The semiconductor memory device of claim 5, wherein the activation control unit comprises:
a delay unit configured to delay the fuse enable signal by a predetermined delay time to output a delayed fuse enable signal; and
an output unit configured to control an activation of the delayed fuse enable signal and output the activation control signal, in response to the repair enable signal.

8. The semiconductor memory device of claim 7, wherein the predetermined delay time is a time for setting the repair enable signal corresponding to the enable fuse after the fuse enable signal is activated.

9. The semiconductor memory device of claim 5, wherein the address fuse unit comprises:
a fuse driving unit configured to be enabled in response to the activation control signal, and drive a voltage of an output node in response to whether or not the address fuse is programmed; and
a fuse information output unit configured to output the output signal by inverting or non-inverting the external address in response to a voltage level of the output node.

10. A method for driving a semiconductor memory device, comprising:
generating a repair enable signal corresponding to whether or not an address fuse is programmed after a power-up operation starts;
generating an activation control signal to control an activation of the fuse enable signal in response to the repair enable signal; and
determining whether or not a driving current path including the address fuse is formed in response to the activation control signal,
wherein the generating of the activation control signal comprises:
delaying the fuse enable signal by a predetermined delay time to output a delayed fuse enable signal; and
controlling an activation of the delayed fuse enable signal and outputting the activation control signal, in response to the repair enable signal.

11. The method of claim 10, further comprising:
generating an output signal in response to a programming state of the address fuse after the driving current path is formed.

12. The method of claim 10, wherein the repair enable signal is generate in response to the fuse enable signal activated after the power-up operation starts.

13. The method of claim 10, wherein the predetermined delay time is a time for setting the repair enable signal after the fuse enable signal is activated.

14. A semiconductor memory device comprising:
an enable fuse unit configured to generate a repair enable signal depending on whether or not an address fuse is programmed, in response to a fuse enable signal;
an activation control unit configured to generate an activation control signal by controlling an activation of the fuse enable signal in response to the repair enable signal; and
an address fuse unit configured to generate an output signal by comparing an external address and a repair target address programmed in the address fuse, in response to the activation control signal,
wherein the enable fuse unit includes an enable fuse which is in a cut state or an uncut state depending on whether or not the address fuse is programmed.

15. The semiconductor memory device of claim 14, wherein the repair enable signal corresponds to a cutting state of the enable fuse.

16. The semiconductor memory device of claim 15, wherein the address fuse unit comprises:
a fuse driving unit configured to drive a voltage of an output node depending on the repair target address, in response to the activation control signal; and
a fuse information output unit configured to output the output signal by inverting or non-inverting the external address in response to the voltage of the output node.

* * * * *